US011475814B2

(12) United States Patent
Lee et al.

(10) Patent No.: US 11,475,814 B2
(45) Date of Patent: Oct. 18, 2022

(54) BRIGHTNESS CONTROLLABLE DISPLAY APPARATUS (71) Applicant: SAPIEN SEMICONDUCTORS INC., Ulsan (KR)

(72) Inventors: Jae Hoon Lee, Busan (KR); Jin Woong Jang, Suwon-Si (KR)

(73) Assignee: SAPIEN SEMICONDUCTORS INC., Ulsan (KR)

(*) Notice: Subject to any disclaimer, the term of this patent is extended or adjusted under 35 U.S.C. 154(b) by 0 days.

(21) Appl. No.: 17/148,840

(22) Filed: Jan. 14, 2021

(65) Prior Publication Data

US 2021/0217343 A1 Jul. 15, 2021

(30) Foreign Application Priority Data

Jan. 15, 2020 (KR) .................. 10-2020-0005399

(51) Int. Cl.
*G11C 19/00* (2006.01)
*G09G 3/20* (2006.01)
*G11C 19/28* (2006.01)
*H03K 7/08* (2006.01)
*G09G 3/36* (2006.01)

(52) U.S. Cl.
CPC ............. *G09G 3/20* (2013.01); *G09G 3/3677* (2013.01); *G11C 19/28* (2013.01); *H03K 7/08* (2013.01); *G09G 2310/0286* (2013.01); *G09G 2320/0626* (2013.01)

(58) Field of Classification Search
None
See application file for complete search history.

(56) References Cited

U.S. PATENT DOCUMENTS

| 4,340,889 A * | 7/1982 | Knight ..................... G09G 3/04 345/691 |
| 9,613,578 B2 * | 4/2017 | Tan ......................... G11C 19/28 |
| 10,657,916 B2 * | 5/2020 | Wu ......................... G11C 19/184 |
| 11,074,854 B1 * | 7/2021 | Lu ........................... G09G 3/3233 |
| 2007/0146290 A1 * | 6/2007 | Hirama ............... G09G 3/3677 345/100 |
| 2013/0118026 A1 * | 5/2013 | DeMarco ................ F26B 5/065 34/284 |
| 2016/0133184 A1 * | 5/2016 | Gupta ................... G09G 3/3233 345/690 |

(Continued)

FOREIGN PATENT DOCUMENTS

KR 100850498 B1 8/2008
KR 20100124338 A 11/2010
(Continued)

*Primary Examiner* — Tuan T Lam
(74) *Attorney, Agent, or Firm* — Osha Bergman Watanabe & Burton LLP (57) ABSTRACT The present specification provides a display apparatus allowing brightness of a display panel to be more finely controlled as compared with the related art. The display apparatus according to the present specification includes a display panel in which a plurality of pixels are arranged in m×n, and K shift register units configured to sequentially output pulse signals having a width adjusted to adjust brightness of the display panel to m horizontal pixel lines, wherein each of the shift register units includes m main flip-flops and m−1 sub-flip-flops connected between the in main flip-flops.

11 Claims, 10 Drawing Sheets (56) References Cited

U.S. PATENT DOCUMENTS

2016/0259455 A1* 9/2016 Li ..................... G06F 3/0412
2017/0068385 A1* 3/2017 Lu ..................... G06F 3/04184
2018/0130407 A1* 5/2018 Zhai ................... G11C 19/28
2019/0340975 A1* 11/2019 Zhai ................... G09G 3/3225

FOREIGN PATENT DOCUMENTS

KR     20170111788 A   10/2017
KR       101942466 B1   4/2019

\* cited by examiner

| On-duty % | 10bit | 9bit | 8bit | 7bit | 6bit | 5bit | 4bit | 3bit | 2bit | 1bit | Sum |
|---|---|---|---|---|---|---|---|---|---|---|---|
| 6% | | 16 | 8 | 4 | 2 | 1 | 0.5 | 0.125 | 0.0625 | 0.03125 | 31.96875 |
| 12% | | 32 | 16 | 8 | 4 | 2 | 1 | 0.25 | 0.125 | 0.0625 | 63.9375 |
| 24% | | 64 | 32 | 16 | 8 | 4 | 2 | 0.5 | 0.25 | 0.125 | 127.875 |
| 48% | | 128 | 64 | 32 | 16 | 8 | 4 | 2 | 0.5 | 0.25 | 255.75 |
| 96% | | 256 | 128 | 64 | 32 | 16 | 8 | 4 | 2 | 0.5 | 511.5 |

1 Cycle ( 533 Row)

| On-duty % | 10bit | 9bit | 8bit | 7bit | 6bit | 5bit | 4bit | 3bit | 2bit | 1bit | Sum |
|---|---|---|---|---|---|---|---|---|---|---|---|
| 6% | 16 | 8 | 8 | 4 | 2 | 1 | 0.5 | 0.25 | 0.125 | 0.0625 | 0.03125 | 31.96875 |
| 9% | 24 | 12 | | 6 | 3 | 1.5 | 0.75 | 0.375 | 0.1875 | 0.09375 | 0.046875 | 47.95313 |
| 12% | 32 | 16 | 16 | 8 | 4 | 2 | 1 | 0.5 | 0.25 | 0.125 | 0.0625 | 63.9375 |
| 15% | 40 | 20 | | 10 | 5 | 2.5 | 1.25 | 0.625 | 0.3125 | 0.15625 | 0.078125 | 79.92188 |
| 18% | 48 | 24 | | 12 | 6 | 3 | 1.5 | 0.75 | 0.375 | 0.1875 | 0.09375 | 95.90625 |
| 21% | 56 | 28 | | 14 | 7 | 3.5 | 1.75 | 0.875 | 0.4375 | 0.21875 | 0.109375 | 111.8906 |
| 24% | 64 | 32 | 32 | 16 | 8 | 4 | 2 | 1 | 0.5 | 0.25 | 0.125 | 127.875 |
| 27% | 72 | 36 | | 18 | 9 | 4.5 | 2.25 | 1.125 | 0.5625 | 0.28125 | 0.140625 | 143.8594 |
| 30% | 80 | 40 | | 20 | 10 | 5 | 2.5 | 1.25 | 0.625 | 0.3125 | 0.15625 | 159.8438 |
| 33% | 88 | 44 | | 22 | 11 | 5.5 | 2.75 | 1.375 | 0.6875 | 0.34375 | 0.171875 | 175.8281 |
| 36% | 96 | 48 | | 24 | 12 | 6 | 3 | 1.5 | 0.75 | 0.375 | 0.1875 | 191.8125 |
| 39% | 104 | 52 | | 26 | 13 | 6.5 | 3.25 | 1.625 | 0.8125 | 0.40625 | 0.203125 | 207.7969 |
| 42% | 112 | 56 | | 28 | 14 | 7 | 3.5 | 1.75 | 0.875 | 0.4375 | 0.21875 | 223.7813 |
| 45% | 120 | 60 | | 30 | 15 | 7.5 | 3.75 | 1.875 | 0.9375 | 0.46875 | 0.234375 | 239.7656 |
| 48% | 128 | 64 | 64 | 32 | 16 | 8 | 4 | 2 | 1 | 0.5 | 0.25 | 255.75 |
| 54% | 144 | 72 | | 36 | 18 | 9 | 4.5 | 2.25 | 1.125 | 0.5625 | 0.28125 | 287.7188 |
| 60% | 160 | 80 | | 40 | 20 | 10 | 5 | 2.5 | 1.25 | 0.625 | 0.3125 | 319.6875 |
| 66% | 176 | 88 | | 44 | 22 | 11 | 5.5 | 2.75 | 1.375 | 0.6875 | 0.34375 | 351.6563 |
| 72% | 192 | 96 | | 48 | 24 | 12 | 6 | 3 | 1.5 | 0.75 | 0.375 | 383.625 |
| 78% | 208 | 104 | | 52 | 26 | 13 | 6.5 | 3.25 | 1.625 | 0.8125 | 0.40625 | 415.5938 |
| 84% | 224 | 112 | | 56 | 28 | 14 | 7 | 3.5 | 1.75 | 0.875 | 0.4375 | 447.5625 |
| 90% | 240 | 120 | | 60 | 30 | 15 | 7.5 | 3.75 | 1.875 | 0.9375 | 0.46875 | 479.5313 |
| 96% | 256 | 128 | 128 | 64 | 32 | 16 | 8 | 4 | 2 | 1 | 0.5 | 511.5 |

BRIGHTNESS CONTROLLABLE DISPLAY APPARATUS

CROSS-REFERENCE TO RELATED APPLICATION

This application claims priority to and the benefit of Korean Patent Application No. 2020-0005399 filed on Jan. 15, 2020, the disclosure of which is incorporated herein by reference in its entirety.

BACKGROUND

1. Field of the Invention

The present invention relates to a method of controlling brightness of a display panel, and more particularly, to a method and apparatus capable of more finely controlling brightness of a display panel as compared with the related art.

2. Discussion of Related Art

Active matrix liquid crystal displays maintain a state in which light is emitted while information of all other pixels is being updated. In the case of a digital method in which a memory is included inside a pixel, during one frame, data related to light to be output by a pixel is stored, and brightness is controlled through a pulse width modulation (PWM) method. In general, when three or four light-emitting elements (for example, light-emitting diodes (LEDs)) are included in one pixel, each light-emitting element is referred to as a subpixel.

Figure 1:
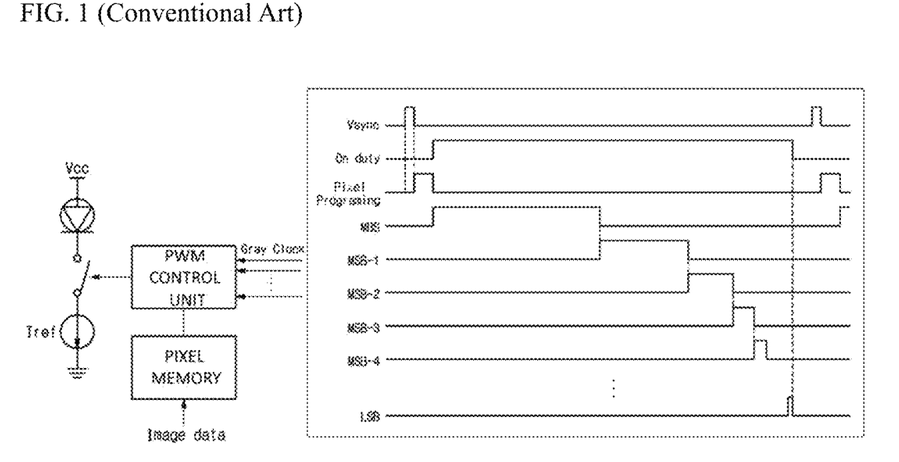
FIG. 1 is a driving circuit diagram of a subpixel according to the related art.

FIG. 1 is a driving circuit diagram of a subpixel according to the related art.

Referring to FIG. 1, the driving circuit diagram and signal timings of a subpixel may be confirmed. In the case of a pixel using a digital PWM driving method, image data is stored in a pixel memory for a predetermined period of time (pixel programming). According to the image data stored in the pixel memory, the subpixel emits light for an emission time (On duty) within one frame. In this case, brightness of the subpixel is controlled through a PWM method. As in an example shown in FIG. 1, gray clock signals for PWM control are input to a driving circuit of the subpixel. The number of gray clock signals MSB, MSB-1, MSB-2, . . . , and LSB is determined according to the number of bits of image data.

Figure 2:
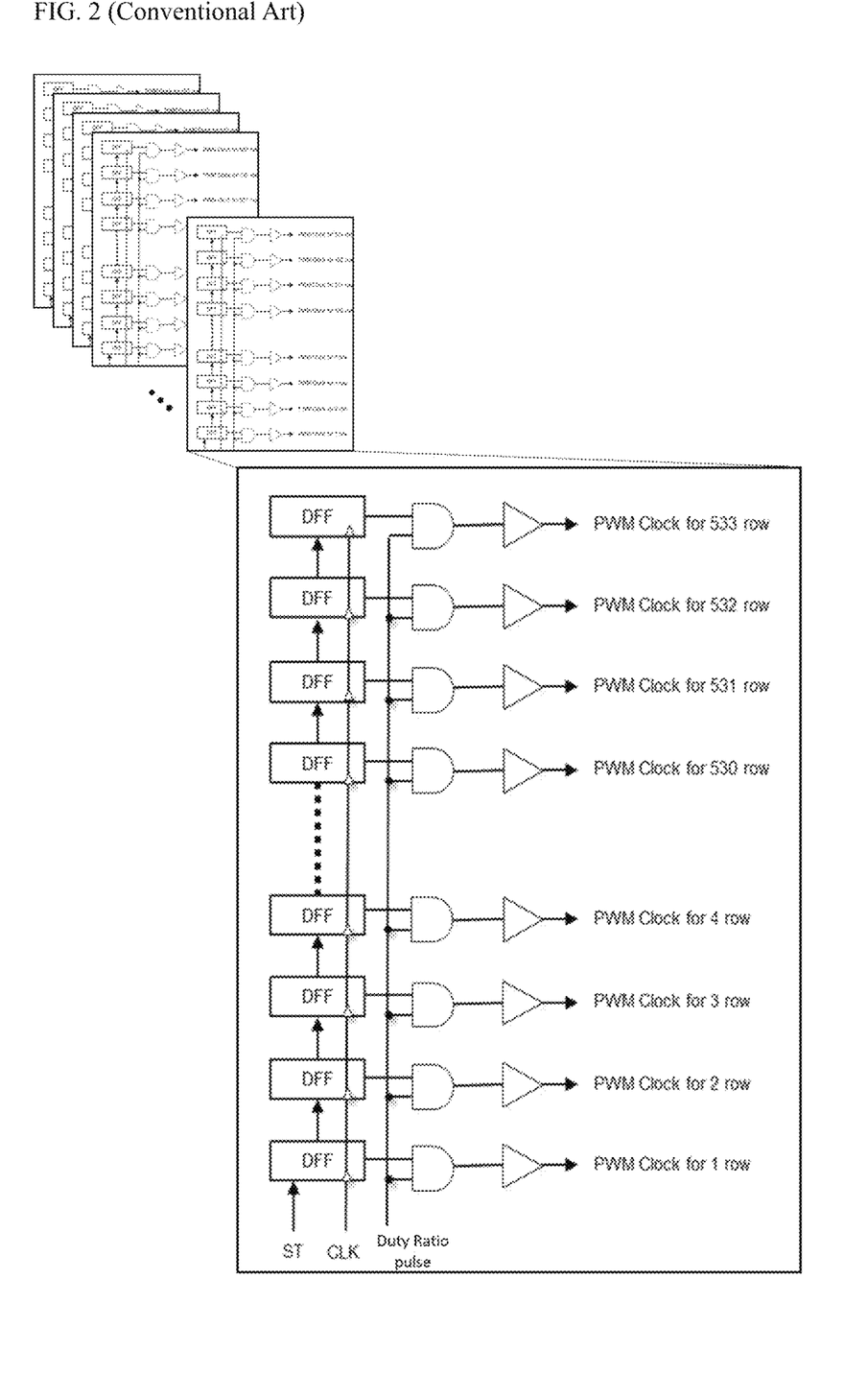
FIG. 2 is an exemplary diagram of shift register units for sequentially outputting gray clock signals according to the related art.

FIG. 2 is an exemplary diagram of shift register units for sequentially outputting gray clock signals according to the related art.

Referring to FIG. 2, it can be confirmed that the plurality of shift register units are shown. The number of the shift register units is proportional to the number of gray clock signals for PWM control. One shift register unit may include a plurality of flip-flops, and the number of the flip-flops is proportional to the number of rows in which pixels are arranged in a display. An example of FIG. 2 corresponds to a case of a display including 533 rows.

Figure 3:
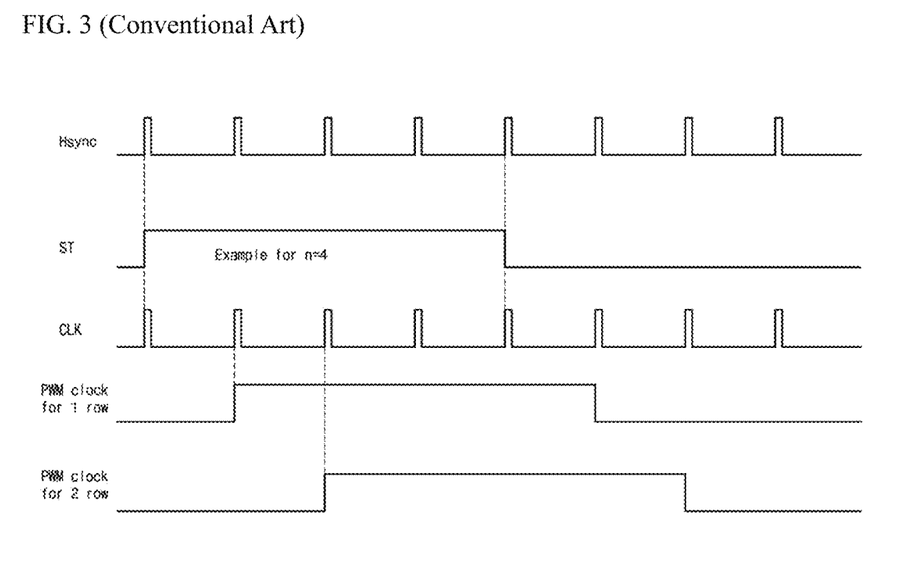
FIG. 3 is a timing diagram of signals input to the shift register units according to the related art.

FIG. 3 is a timing diagram of signals input to the shift register units according to the related art.

Referring to FIG. 3, it can be confirmed that five signals are shown. A signal "Hsync" indicates a timing at which a signal moves for every row in the display. A signal "ST" is a pulse signal with respect to a time at which an LED emits light in relation to PWM control. An example shown in FIG. 3 is an example in which the signal ST, which has a length corresponding to four times a pulse period of 1H included in the Hsync, is shown. A signal "CLK" is a signal input to the plurality of flip-flops in the shift register unit. The signal "CLK" has a pulse with the same period as a pulse period in the signal "Hsync." Accordingly, the signal "ST" input to a first flip-flop by the signal "CLK" may be synchronized with the pulse period of the signal "Hsync" to output from a next flip-flop (see fourth and fifth signals).

Meanwhile, when the length of the signal ST is greater than the pulse period of 1H included in the Hsync, a consecutive "high" signal is input to "Duty Ratio pulse" of FIG. 2. On the contrary, when the length of the signal ST is smaller than the pulse period of 1H included in the Hsync, a signal having a "high" width is input as the "Duty Ratio pulse" of FIG. 2 according to a brightness ratio. The brightness ratio is set based on 100% of the pulse width of 1H included in the Hsync.

Figure 4:
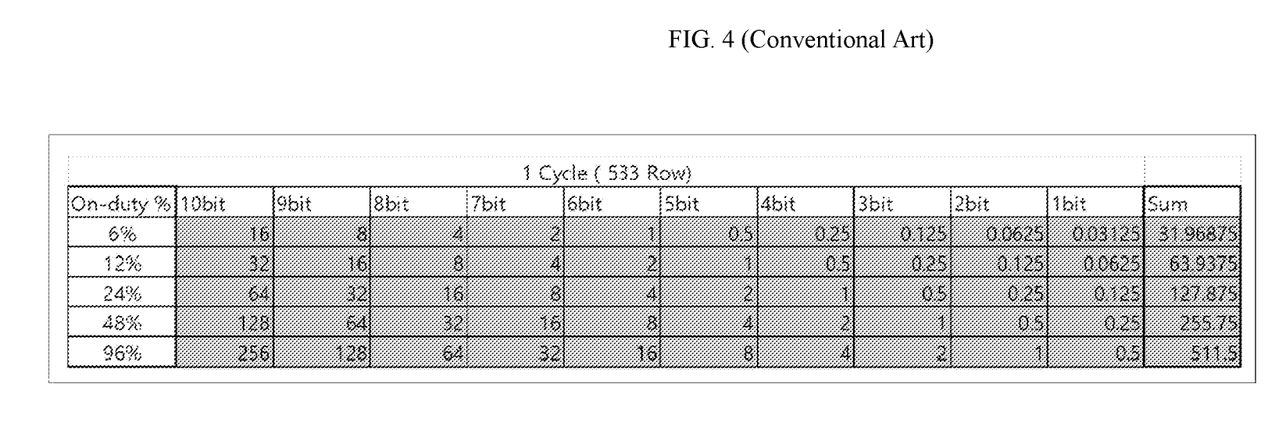
FIG. 4 shows an example of brightness capable of being expressed through a conventional pulse width modulation (PWM) control method.

FIG. 4 shows an example of brightness capable of being expressed through the conventional PWM control method.

The example shown in FIG. 4 corresponds to a case in which a display includes 533 rows and a case in which image data stored in a pixel memory has 10 bits. As can be confirmed in FIG. 4, with respect to 96%, brightness control is possible only at 48% that is 0.5 times, 24% that is 0.25 times, 12% that is 0.125 times, and 6% that is 0.0625 times. This is because a pulse width input to the "Duty Ratio pulse" can be controlled only in powers of two. More specifically, when a pulse width of the signal ST is an integer multiple of the pulse width of 1H included in the Hsync, the pulse width of the signal ST may not have a ratio below a decimal point. Accordingly, in the signal ST having a bit greater than a bit of a signal having the same length of 1H as the pulse width 1H included in the Hsync, only a signal having a length of powers of 2 (1H×2/\n) can be selected. Therefore, there is inevitably a limitation in setting the optimal image and power consumption.

RELATED ART DOCUMENTS

Patent Documents

Korean Patent Application Publication No. 10-2017-0111788

SUMMARY OF THE INVENTION

The present invention is directed to providing a display apparatus allowing brightness of a display panel to be more finely controlled as compared with the related art.

Objects of the present specification are not limited to the aforementioned objects and other objects not mentioned herein will be clearly understood from the following description by those skilled in the art.

According to an aspect of the present invention, there is provided a display apparatus including a display panel in which a plurality of pixels are arranged in m×n, and K shift register units configured to sequentially output pulse signals having a width adjusted to adjust brightness of the display panel to m horizontal pixel lines, wherein each of the shift register units includes: m main flip-flops, and m−1 sub-flip-flops connected between the m main flip-flops.

Each of the shift register units may include a pulse signal input terminal to which the pulse signal having the width adjusted according to the adjustment of the brightness of the display panel is input, a clock input terminal to which clock signals input to clock terminals of the m main flip-flops and the m−1 sub-flip-flops are input, a duty ratio signal input terminal to which a pulse signal having a duty ratio adjusted according to a pulse width of the signal input to the pulse signal input terminal is input, and M AND gates each having two input terminals connected to an output terminal of each main flip-flop and the duty ratio signal input terminal and an output terminal connected to the horizontal pixel line. The display apparatus may further include a control unit configured to perform a control such that a signal is output to each of the pulse signal input terminal, the clock input terminal, and the duty ratio signal input terminal.

The control unit may perform a control such that a pulse signal having a width of $$(1H \times a) + \left(1H \times \frac{b}{2^c}\right)$$

is output to the pulse signal input terminal according to the adjustment of the brightness of the display panel, wherein a is an integer of zero or more, c is an integer of zero or more, b is an integer of zero or more and $2^c-1$ or less, and 1H refers to a period of a horizontal sync signal for sequentially controlling outputs in the m horizontal pixel lines. The control unit may perform a control such that a signal delayed by $1H \times \frac{1}{2}^c$ relative to the horizontal sync signal is output to the pulse signal input terminal.

The control unit may perform a control such that a first clock pulse having a period of 1H and a second clock pulse spaced apart from the first clock pulse by an interval of $1H \times b/2^c$ are repeatedly output to the clock input terminal. The control unit may perform a control such that a signal delayed by $1H \times \frac{1}{2}^c$ relative to the horizontal sync signal is output to the clock input terminal.

The display apparatus may further include a bypass circuit unit configured to directly connect the m main flip-flops in response to a control signal of the control unit.

When "b" is zero, the control unit may output the control signal for directly connecting the m main flip-flops to the bypass circuit.

When "a" is zero, the control unit may output the control signal for directly connecting the m main flip-flops to the bypass circuit.

When "a" is zero, the control unit may perform a control such that a pulse signal having a width of 1H is output to the pulse signal input terminal. The control unit may perform a control such that a signal delayed by $1H \times \frac{1}{2}^c$ relative to the horizontal sync signal is output to the pulse signal input terminal.

When "a" is zero, the control unit may perform a control such that a clock pulse having a period of 1 H and a length of $1H \times b/2^c$ is repeatedly output to the clock input terminal and the duty ratio signal input terminal. The control unit may perform a control such that a signal delayed by $1H \times \frac{1}{2}^c$ relative to the horizontal sync signal is output to the clock input terminal and the duty ratio signal input terminal.

Other concrete matters of the present invention are included in the detailed description and drawings of the specification.

DETAILED DESCRIPTION OF EXEMPLARY EMBODIMENTS

Advantages and features of the invention disclosed in the present specification and methods for accomplishing the same will be more clearly understood from embodiments described below with reference to the accompanying drawings. However, the present specification is not limited to the following embodiments but may be implemented in various different forms. The embodiments are provided only to complete the disclosure of the present specification and to fully provide a person having ordinary skill in the art to which the present invention pertains (hereinafter, referred to as those skilled in the art) with the category of the present specification. The scope of the technical spirit of the present specification is only defined by the scope of accompanying claims.

The terms used in the present specification are for describing the embodiments and are not intended to limit the scope of the technical spirit of the present specification. As used herein, singular expressions, unless defined otherwise in context, include plural expressions. The meaning of "comprises" and/or "comprising" used in this specification does not exclude the existence or addition of one or more other components in addition to the mentioned components. The same reference numerals denote the same components throughout the specification. As used herein, the term "and/or" includes any and all combinations of one or more of the associated components. It will be understood that, although the terms "first," "second," and the like may be used herein to describe various components, these components should not be limited by these terms. These terms are only used to distinguish one component from another component. Therefore, a first component described below could be termed a second component without departing from the scope and spirit of the present invention.

Unless otherwise defined, all terms (including technical and scientific terms) used in the present specification may be used with the same meaning which may be commonly understood by the person with ordinary skill in the art to which the present invention belongs. In addition, it will be further understood that terms defined in commonly used dictionaries should not be interpreted in an idealized or excessive sense unless expressly and specifically defined. Hereinafter, embodiments of the present invention will be described in detail with reference to the accompanying drawings.

Figure 5:
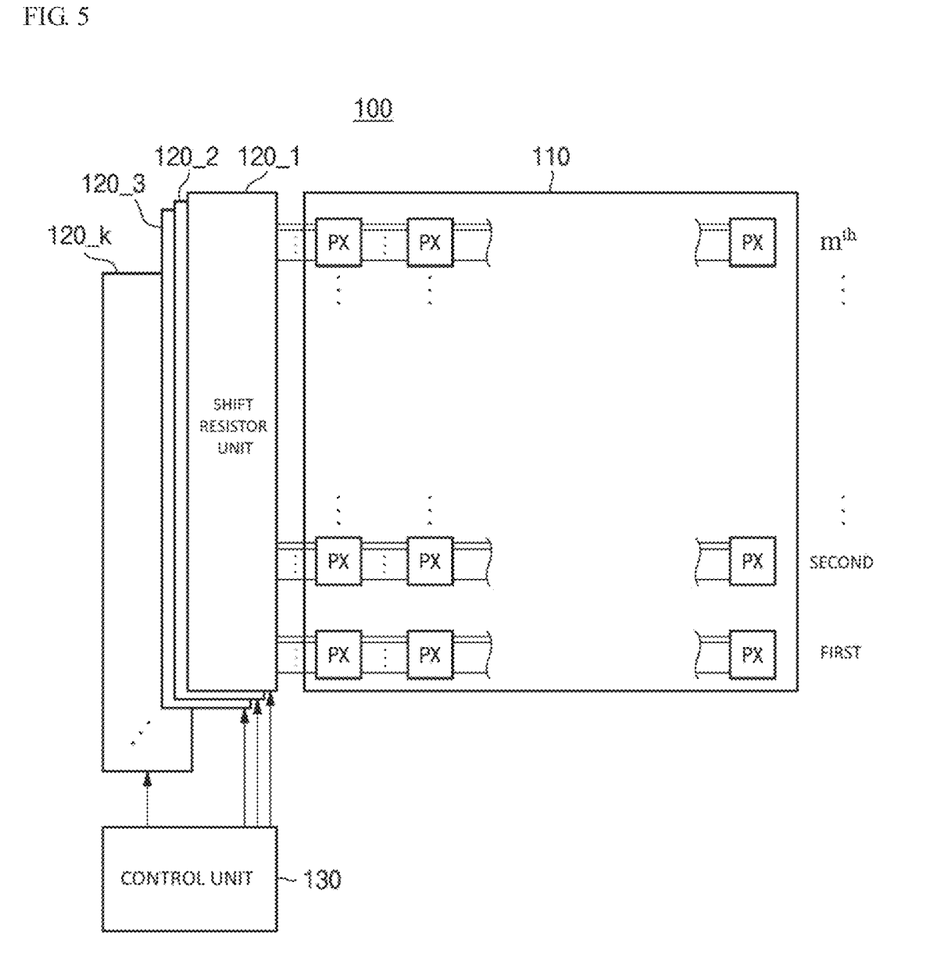
FIG. 5 is a schematic block diagram illustrating a configuration of a display apparatus according to the present specification.

FIG. 5 is a schematic block diagram illustrating a configuration of a display apparatus according to the present specification.

Referring to FIG. 5, a display apparatus 100 according to the present specification may include a display panel 110 and k shift register units 120_1, 120_2, . . . , and 120_m.

The display panel 110 may include a plurality of pixels PX according to the present specification. The plurality of pixels PX may be provided as m×n pixels PX arranged in a matrix form (wherein m and n are natural numbers). However, the plurality of pixels may be arranged in various patterns having a zigzag form and the like according to embodiments. In the present specification, an example in which m is 533 will be mainly described. However, the display apparatus 100 according to the present specification is not limited to the above example.

The display panel 110 may be implemented as one of a liquid crystal display (LCD), a light-emitting diode (LED) display, an organic LED (OLED) display, an active-matrix OLED (AMOLED) display, an electrochromic display (ECD), a digital mirror device (DMD), an actuated mirror device (AMD), a grating light valve (GLV), a plasma display panel (PDP), an electro luminescent display (ELD), and a vacuum fluorescent display (VFD) and may be implemented as other types of flat panel displays or flexible display device. In the present specification, an example of an LED display panel will be described.

Each pixel PX may include a plurality of light-emitting elements. The light-emitting element may be an LED. The LED may be a micro LED having a size of 80 μm or less. One pixel PX may output light with various colors through the plurality of light-emitting elements having different colors. For example, one pixel PX may include red, green, and blue light-emitting elements. For another example, when a white light-emitting element may be further included, the white light-emitting element may replace any one of the red, green, and blue light-emitting elements. Each light-emitting element included in one pixel PX is referred to as a "subpixel."

Each subpixel may store data related to brightness, that is, a gradation of a color to be output during one image frame. A size of the data related to the gradation may vary, and in the present specification, an example of 10 bits will be described. However, the display apparatus 100 according to the present specification is not limited to the above example.

The shift register units 120 may sequentially output pulse signals, which have a width adjusted in order to adjust the brightness of the display panel 110, to m horizontal pixel lines. When the size of the data related to the gradation is 10 bits, "k" may be 10. Therefore, in the present specification, ten shift register units 120 may be included.

The horizontal pixel line means an electrical connection connected such that a signal output from each shift register unit 120 is input to the pixel. The horizontal pixel line may be connected in parallel to all pixels connected to the same row. In addition, when "m" is 533, each shift register unit 120 may include 533 horizontal pixel lines.

Figure 6:
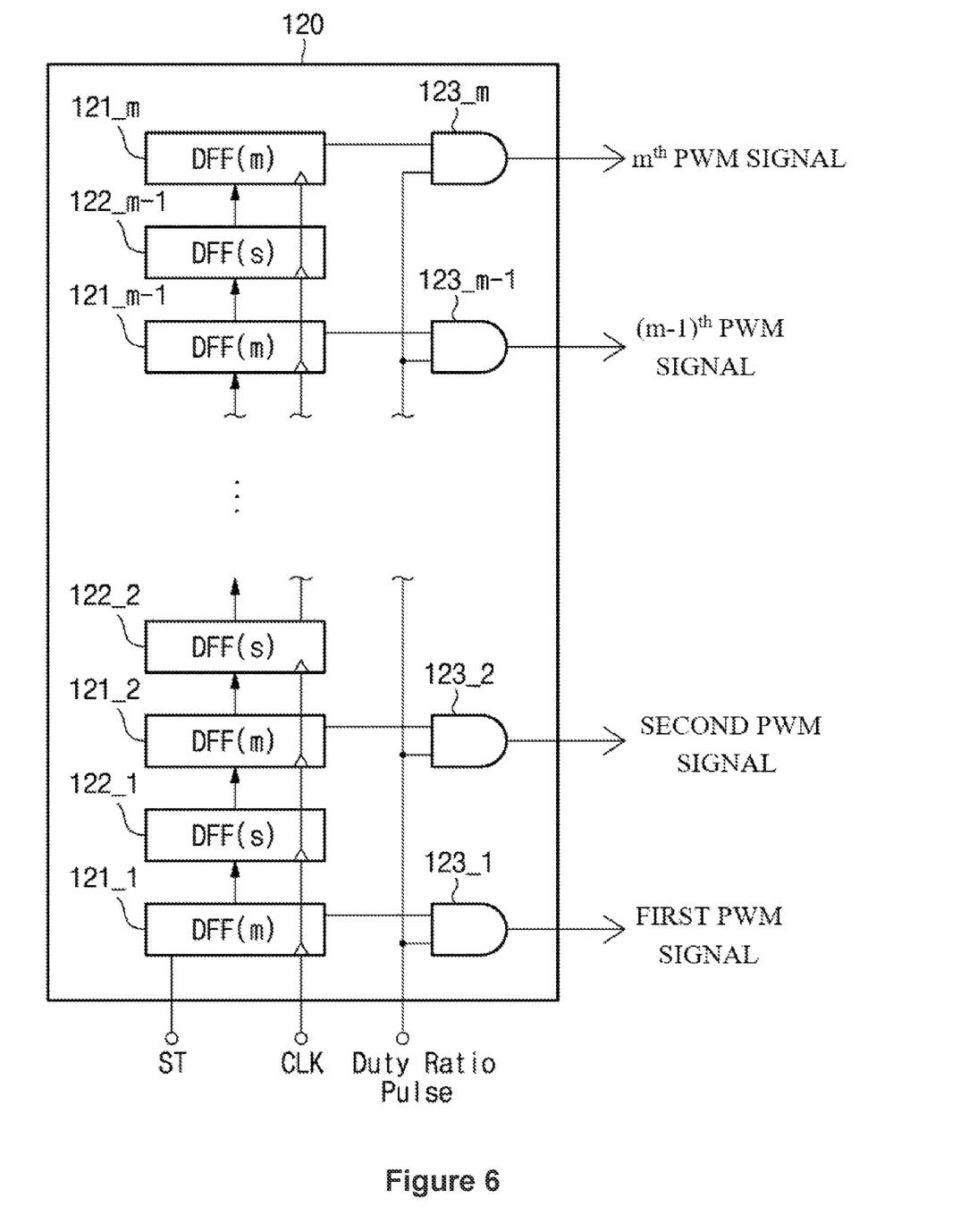
FIG. 6 is a schematic circuit diagram illustrating a configuration of a shift register unit according to the present specification.

FIG. 6 is a schematic circuit diagram illustrating a configuration of the shift register unit according to the present specification.

Referring to FIG. 6, each shift register unit 120 may include m main flip-flops 121_1, 121_2, . . . , and 121_m and m−1 sub-flip-flops 122_1, 122_2, . . . , and 122_m−1 connected between the m main flip-flops 121_1, 121_2, . . . , and 21_m. The m main flip-flops and the m−1 sub-flip-flops may be connected in series. Accordingly, a signal output from the main flip-flop may be input to the next sub-flip-flop, and a signal output from the sub-flip-flop may be input to the next main flip-flop. Through a series connection between the m main flip-flops and the m−1 sub-flip-flops, a signal may be sequentially transmitted to the next flip-flops.

Meanwhile, in the present specification, the main flip-flop 121_1 shown at the bottom will be referred to as a "first main flip-flop." Accordingly, the first main flip-flop first receives a signal. However, unlike the example shown in the drawing of the present specification, a signal may first be input to the main flip-flop shown at the top. That is, an input direction of a signal may be selected according to a designer, and the display apparatus 100 according to the present specification is not limited by the example shown in the present specification.

In addition, each of the shift register units 120 may include a pulse signal input terminal ST, a clock input terminal CLK, a duty ratio signal input terminal (Duty Ratio Pulse), and m AND gates 123_1, 123_2, . . . , and 123_m.

A pulse signal, which has a width adjusted according to an adjustment of brightness of the display panel, may be input to the pulse signal input terminal ST. Lengths of pulse signals input to the pulse signal input terminals ST of the shift register units 120 may be different. More specifically, the lengths of the pulse signals input to the pulse signal input terminals ST of the adjacent shift register units 120 may have a difference of two times. A shift register unit corresponding to a most significant bit (MSB) of gradation data input to the pixel is referred to as a first shift register unit 120_1, and a shift register unit corresponding to a next significant bit thereof is referred to as a second shift register unit 120_2. In this case, a length of a pulse signal input to the pulse signal input terminal ST of the first shift register unit 120_1 is twice that of a pulse signal input to the pulse signal input terminal ST of the second shift register unit 120_2. Therefore, for example, when a size of gradation data input to the pixel is 10 bits, a length of a pulse signal input to the pulse signal input terminal ST of the first shift register 120_1 is 512 times a length of a pulse signal input to the pulse signal input terminal ST of a tenth shift register 120_10 corresponding to a least significant bit (LSB). Meanwhile, the characteristics of the pulse signal input to the pulse signal input terminal ST will be described in more detail below.

A clock signal, which is input to clock terminals of the m main flip-flops 121_1, 121_2, . . . , and 121_m and the m−1 sub-flip-flops 122_1, 122_2, . . . , and 122_m−1, may be input to the clock signal input terminal CLK. The characteristics of the clock signal input to the clock input terminal CLK will be described in more detail below.

A pulse signal, which has a duty ratio adjusted according to a pulse width of a signal input to the pulse signal input terminal ST, may be input to the duty ratio signal input terminal (Duty Ratio Pulse). The characteristics of the pulse signal input to the duty ratio signal input terminal will be described in more detail below.

Each AND gate 123 may include two input terminals connected to an output terminal of each main flip-flop 121 and the duty ratio signal input terminal (Duty Ratio Pulse) and an output terminal connected to the horizontal pixel line. Therefore, during a period in which a logic high section of a signal output from the main flip-flop 121 overlaps a logic high section of a signal input to the duty ratio signal input terminal (Duty Ratio Pulse), a logic high signal may be output to the horizontal pixel line.

Meanwhile, the display apparatus 100 according to the present specification may further include a control unit 130 that performs a control such that a signal is output to each of the pulse signal input terminal ST, the clock input terminal CLK, and the duty ratio signal input terminal (Duty Ratio Pulse). The signal may be directly output by the control unit 130, and a separate component configured to output a signal may be controlled to output an appropriate signal.

Hereinafter, signals input to the pulse signal input terminal ST, the clock input terminal CLK, and the duty ratio signal input terminal (Duty Ratio Pulse) in order to adjust the brightness of the display panel 110 will be described in more detail. To this end, a period of sequentially outputting signals to m horizontal pixel lines will be described first.

Figure 7:
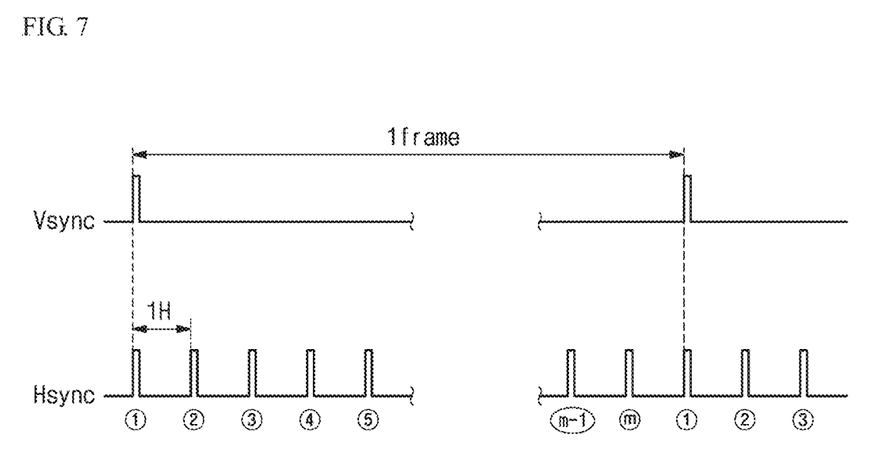
FIG. 7 is a reference diagram of a signal that is a reference for control in the display apparatus.

FIG. 7 is a reference diagram of a signal that is a reference for control in the display apparatus.

In the display panel 110, during one frame, gradation data of all pixels are input, and each pixel emits light. In this case, the gradation data is sequentially input to the same pixels in a lateral direction in the display panel 110. Referring to FIG. 7, a signal "Vsync" for synchronizing frames and a signal "Hsync" (hereinafter, referred to as "horizontal sync signal") for sequentially inputting gradation data between horizontal lines can be confirmed. An interval of the horizontal sync signal corresponds to a period in which a signal is sequentially output to the m horizontal pixel lines in the display panel 110. In the present specification, the interval of the horizontal sync signal will be denoted as "1H."

Meanwhile, in the display apparatus 100 according to the present specification, brightness may be more finely controlled as compared with a display apparatus in which brightness is controlled through a conventional PWM method. As described above, in the display apparatus in which brightness is controlled through the conventional PWM method, when a pulse width is an integer multiple of 1H of the horizontal sync signal, the pulse width may not have a ratio below a decimal point. For example, in the related art, a signal having a pulse width that is an integer multiple such as 2H, 4H, or 8H may be used for brightness control, but a signal having a ratio below a decimal point such as 2.5H, 4.5H, or 8.5H may not be used. However, the display apparatus 100 according to the present specification is characterized in that a signal having a ratio below a decimal point such as 2.5H, 4.5H, or 8.5H can be used. In this case, a signal input to the pulse signal input terminal ST, which is a signal having a length of 1H or more, may be distinguished from a signal input to the pulse signal input terminal ST, which is a signal having a length of 1H or less. First, the signal input to the pulse signal input terminal ST, which is the signal having a length of 1 H or more, will be described.

Figure 8:
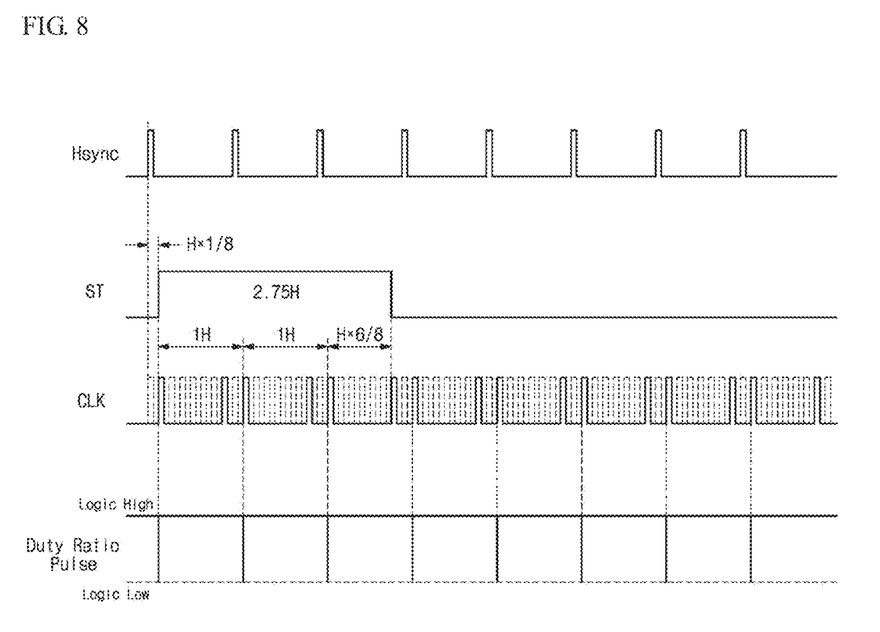
FIG. 8 is an exemplary waveform diagram of a signal in which a length of a pulse signal is 1H or more.

FIG. 8 is an exemplary waveform diagram of a signal in which a length of a pulse signal is 1H or more.

Referring to FIG. 8, waveforms of signals input to the pulse signal input terminal ST, the clock input terminal CLK, and the duty ratio signal input terminal (Duty Ratio Pulse) can be confirmed.

First, describing the signal input to the pulse signal input terminal ST, it can be seen that a signal having a period of 2.75H is input. The present invention is different from the related art in that a signal having a signal length of 1H or more may have a value below a decimal point. That is, the control unit 130 may perform a control such that a pulse signal having a width of $$(1H \times a) + \left(1H \times \frac{b}{2^c}\right)$$

is output to the pulse signal input terminal ST according to an adjustment of brightness of the display panel 110. "a" is an integer of zero or more, "c" is an integer of zero or more, and "b" is an integer of zero or more and $2^c-1$ or less. In the example shown in FIG. 8, a is two, b is six, and c is three.

Next, describing the signal input to the clock input terminal CLK, it can be seen that two pulses are periodically repeated. The control unit 130 may perform a control such that a first clock pulse having a period of 1H and a second clock pulse spaced apart from the first clock pulse by an interval of $1H \times b/2^c$ are repeatedly output to the clock input terminal CLK. The main flip-flop 121 may transmit the signal input to the pulse signal input terminal ST to the next sub-flip-flop 122 in response to the first clock pulse, and the sub-flip-flop 122 may transmit the signal input to the pulse signal input terminal ST to the next main flip-flop 121 in response to the second clock pulse. Accordingly, a signal input to the pulse signal input terminal ST may be exactly transmitted from a previous main flip-flop to a next main flip-flop in a period of 1H.

When the signal input to the pulse signal input terminal ST is the signal having a length of 1H or more, the control unit 130 may perform a control such that a signal having a length of 1H is repeatedly output to the duty ratio signal input terminal (Duty Ratio Pulse) in a period of 1H. That is, the control unit 130 may perform a control such that consecutive logic high signals are output to the duty ratio signal input terminal (Duty Ratio Pulse).

Thus, the signal input to the pulse signal input terminal ST according to the adjustment of the brightness of the display panel 110 may be output to the horizontal pixel line through the main flip-flop 121 and the AND gate 123.

Meanwhile, k shift register units 120_1, 120_2, . . . , and 120_k may sequentially output a signal to one horizontal pixel line. In the related art, since an end point of a signal input to the pulse signal input terminal ST coincides with the horizontal sync signal, a time point at which a signal ends in a shift register unit corresponding to an upper significant bit may be discriminated from a time point at which a signal starts in a shift register unit corresponding to a next significant bit. In the display apparatus 100 according to the present specification, an end point of the signal input to the pulse signal input terminal ST may not coincide with the horizontal sync signal. Accordingly, there is a need for a method of discriminating a time point at which a signal ends in a shift register unit corresponding to an upper significant bit.

To this end, the control unit 130 may perform a control such that a signal delayed by $1H \times \frac{1}{2^c}$ relative to the horizontal sync signal is output to the clock input terminal CLK. In addition, the control unit 130 may perform a control such that a signal delayed by $1H \times \frac{1}{2^c}$ relative to the horizontal sync signal is output to the pulse signal input terminal ST.

Meanwhile, "b" may be an integer of zero or more and $2^c-1$ or less and may be variously set. Unlike the example shown in FIG. 8, when b is zero, a length of a signal input to the pulse signal input terminal ST is an integer multiple of 1H. The second clock pulse overlaps the first clock pulse. Since the case is the same as in the related art, a signal output from the main flip-flop 121 may be output to the next main flip-flop 121 without needing to pass through the sub-flip-flop 122.

To this end, the display apparatus 100 according to the present specification may further include a bypass circuit unit (not shown) for directly connecting the m main flip-flops 121_1, 121_2, . . . , and 121_m in response to a control signal of the control unit 130. When "b" is zero, the control unit 130 may output a control signal for directly connecting the m main flip-flops 121_1, 121_2, . . . , and 121_m to the bypass circuit. When the bypass circuit unit is operated, and when a signal output from the first main flip-flop 121_1 is output directly to a second main flip-flop 121_2, a signal output from the second main flip-flop 121_2 may be output directly to a third main flip-flop 121_3.

This concludes the above description of a case in which the signal input to the pulse signal input terminal ST is the signal having a length of 1H or more, and a case will be described in which the signal input to the pulse signal input terminal ST is the signal having a length less than 1H.

The case in which the signal input to the pulse signal input terminal ST, which is the signal having a length less than 1H, corresponds to a case in which "a" is zero. When "a" is zero, the control unit 130 may output a control signal for directly connecting the m main flip-flops 121_1, 121_2, . . . , and 121_m to the bypass circuit unit.

Figure 9:
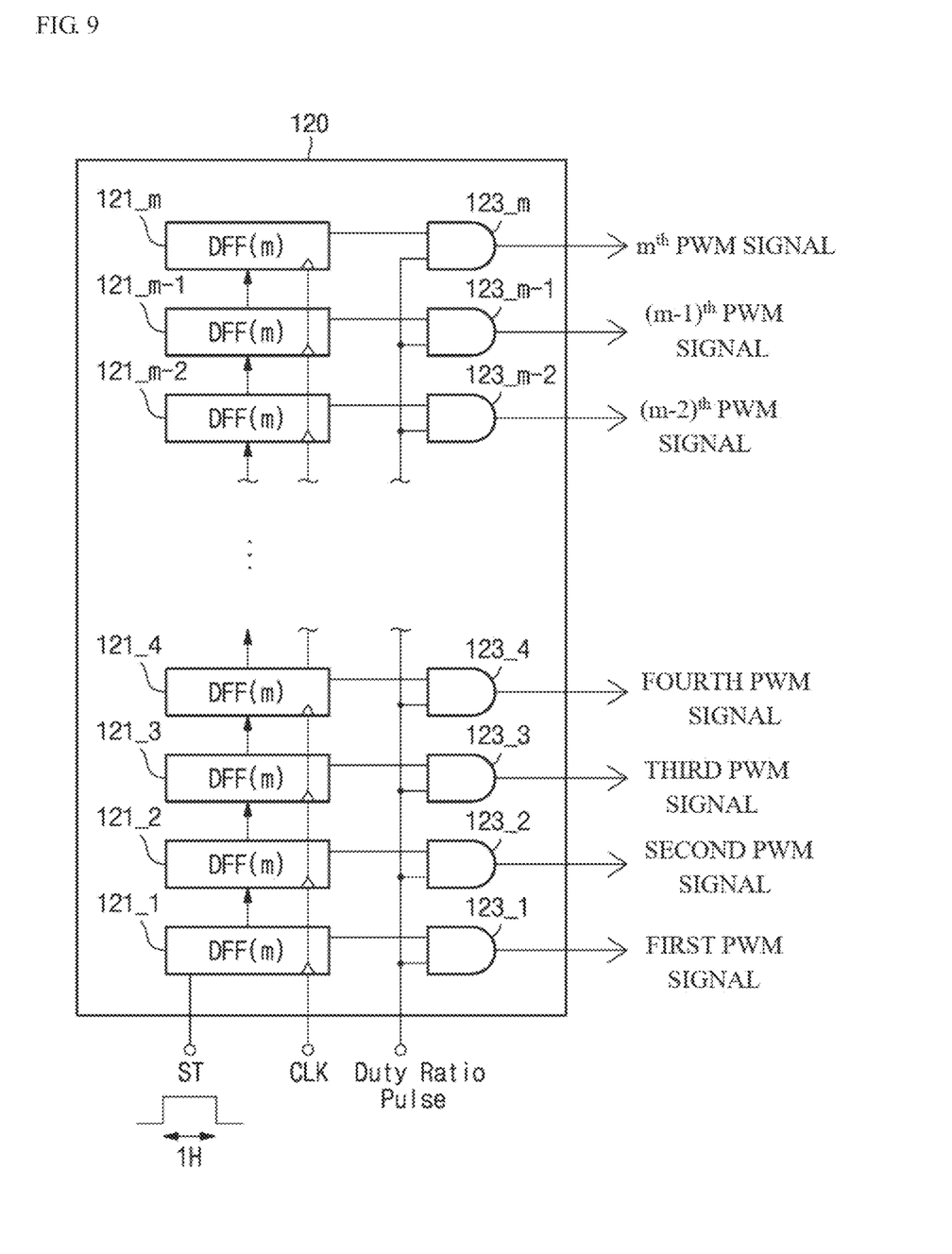
FIG. 9 is a schematic circuit diagram illustrating a state in which m main flip-flops are directly connected by a bypass circuit unit according to the present specification.

FIG. 9 is a schematic circuit diagram illustrating a state in which the m main flip-flops are directly connected by the bypass circuit unit according to the present specification.

Referring to FIG. 9, a state in which the m main flip-flops are directly connected can be confirmed. In this case, the control unit 130 may perform a control such that a pulse signal having a width of 1H is output to the pulse signal input terminal ST. In addition, the control unit 130 may perform a control such that a clock pulse having a period of 1H and having a length of $1H \times b/2^c$ is repeatedly output to the clock input terminal CLK and the duty ratio signal input terminal (Duty Ratio Pulse). That is, the same signal may be input to the clock input terminal CLK and the duty ratio signal input terminal (Duty Ratio Pulse).

Figure 10:
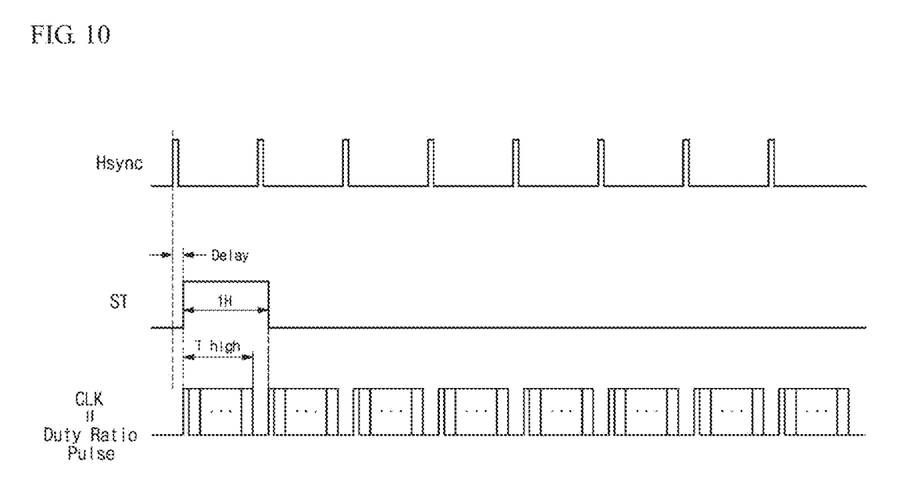
FIG. 10 is an exemplary waveform diagram of a signal in which a length of a pulse signal is less than 1H.

FIG. 10 is an exemplary waveform diagram of a signal in which a length of a pulse signal is less than 1 H.

Referring to FIG. 10, signals input to the pulse signal input terminal ST, the clock input terminal CLK, and the duty ratio signal input terminal (Duty Ratio Pulse) can be confirmed. Since a start point of the signal input to the clock input terminal CLK has a period of 1H, the signal input to the pulse signal input terminal ST may be exactly transmitted from a previous main flip-flop to a next main flip-flop in a period of 1H. In addition, the signal input to the duty ratio signal input terminal (Duty Ratio Pulse) is output to the horizontal pixel line through the AND gate 123 so that a signal having a length of $1H \times b/2^c$, that is, a length less than 1H, may be output to the horizontal pixel line.

Meanwhile, among the k shift register units 120_1, 120_2, . . . , and 120_k, an xm shift register unit 120_x may output a signal of 1H or more, and an $(x+1)^{th}$ shift register unit 120_x+1 may output a signal of less than 1H. In this case, it is necessary to discriminate a time point at which the signal output from the $x^t$ shift register unit 120_x ends. To this end, the control unit 130 may perform a control such that a signal delayed by $1H \times \frac{1}{2}^c$ relative to the horizontal sync signal is output to the pulse signal input terminal ST. In addition, the control unit 130 may perform a control such that a signal delayed by $1H \times \frac{1}{2}^c$ relative to the horizontal sync signal is output to the clock input terminal CLK and the duty ratio signal input terminal (Duty Ratio Pulse).

Figure 11:
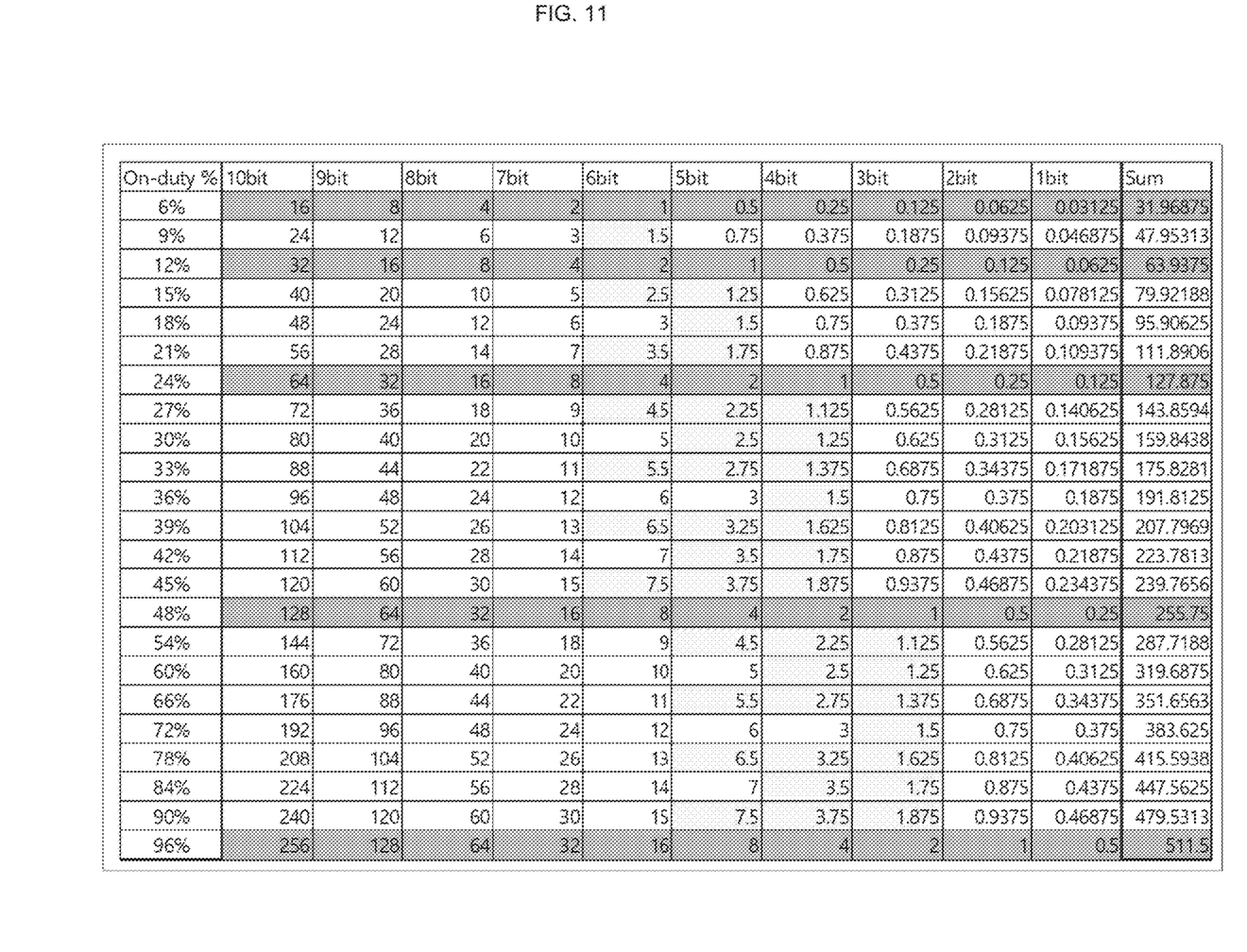
FIG. 11 is an exemplary diagram of brightness controllable in the display apparatus according to the present specification.

FIG. 11 is an exemplary diagram of brightness controllable in the display apparatus 100 according to the present specification.

Referring to FIG. 11, values indicated in green are brightness that may be controlled through a PWM method according to the related art, and values indicated in yellow are brightness that may be newly controlled through a PWM method according to the present specification.

Meanwhile, in order to execute the above-described control logic, the control unit 130 may include a processor, an application-specific integrated circuit (ASIC), other chipsets, a logic circuit, a register, a communication modem, a data processing device, and the like, known in the technical field to which the present invention pertains. In addition, when the above-described control logic is implemented in software, the control unit 130 may be implemented in a set of computer program modules. In this case, the program module may be stored in a memory and executed by a processor.

The computer program may include a code encoded in a computer language such as C/C++, C#, JAVA, Python, a machine language, or the like that may be read by a processor (CPU) of a computer through a device interface of the computer in order to cause the computer to read the program and execute the methods implemented in the program. This code may include functional codes related to functions or the like that define the necessary functions for executing the methods and include control codes related to the execution procedures necessary to cause the processor of the computer to execute the functions in a predetermined procedure.

In addition, the code may further include a memory reference related code for additional information or media necessary to cause the processor of the computer to perform the functions as to which location (address) of the computer's internal or external memory should be referenced. Furthermore, when the processor of the computer needs to communicate with any other computers or servers remotely to perform the functions, the code may further include a communication related code as to whether how to communicate with any other computers or servers remotely using the communication module of the computer or which information or media should be transmitted or received during communication.

The stored medium is not a medium for storing data for a short time, such as a register, a cache, or a memory and refers to a medium which semi-permanently stores data and is capable of being read by a device. Examples of the stored medium include read-only memories (ROMs), random-access memories (RAMs), compact disc ROMs (CD-ROMs), magnetic tapes, floppy disks, and optical data storage devices, but the present invention is not limited thereto. That is, the program may be stored in various recording media used for various servers accessible by the computer, or on various recording media used for the user's computer. In addition, the medium may be distributed over a network-connected computer system, and a computer-readable code may be stored in a distributed manner.

According to an aspect of the present specification, it is possible to more finely control the brightness of a display panel as compared with the related art.

According to another aspect of the present specification, optimal brightness can be adjusted according to display quality or power consumption.

Effects of the present invention are not limited to the above-described effects, and other effects not described above may be clearly understood to those skilled in the art from the description below.

Although the embodiments of the present invention have been described with reference to the accompanying drawings, it should be understood that those skilled in the art can carry out other modifications without changing the technical spirit or essential features of the present invention. Therefore, it should be understood that the embodiments described herein are illustrative and not restrictive in all aspects.

What is claimed is:

1. A display apparatus comprising:
a display panel in which a plurality of pixels are arranged in m×n; and
K shift register units configured to sequentially output pulse signals having a width adjusted to adjust brightness of the display panel to m horizontal pixel lines,
wherein each of the shift register units includes:
m main flip-flops;
m−1 sub-flip-flops connected between the m main flip-flops;
a pulse signal input terminal to which one of the pulse signals, having the width adjusted according to the adjustment of the brightness of the display panel, is input;
a clock input terminal to which clock signals, input to clock terminals of the m main flip-flops and the m−1 sub-flip-flops, are input;
a duty ratio signal input terminal to which a pulse signal, having a duty ratio adjusted according to a pulse width of the signal input to the pulse signal input terminal, is input;
m AND gates each having two input terminals connected to an output terminal of each main flip-flop and the duty ratio signal input terminal and an output terminal connected to the horizontal pixel line; and
wherein the m−1 sub-flip-flops are not connected to the m AND gates.

2. The display apparatus of claim 1, further comprising a control unit configured to perform a control such that a signal is output to each of the pulse signal input terminal, the clock input terminal, and the duty ratio signal input terminal,
wherein the control unit performs a control such that a pulse signal having a width of $$(1H \times a) + \left(1H \times \frac{b}{2^c}\right)$$

is output to the pulse signal input terminal according to the adjustment of the brightness of the display panel, wherein a is an integer of zero or more, c is an integer of zero or more, b is an integer of zero or more and $2^c-1$ or less, and 1H refers to a period of a horizontal sync signal for sequentially controlling outputs in the m horizontal pixel lines.

3. The display apparatus of claim 2, wherein the control unit performs a control such that a signal delayed by 1H $1/2^c$ relative to the horizontal sync signal is output to the pulse signal input terminal.

4. The display apparatus of claim 2, wherein the control unit performs a control such that a first clock pulse having a period of 1H and a second clock pulse spaced apart from the first clock pulse by an interval of 1H×b/$2^c$ are repeatedly output to the clock input terminal.

5. The display apparatus of claim 4, wherein the control unit performs a control such that a signal delayed by 1H $1/2^c$ relative to the horizontal sync signal is output to the clock input terminal.

6. The display apparatus of claim 2, further comprising a bypass circuit unit configured to directly connect the m main flip-flops in response to a control signal of the control unit.

7. The display apparatus of claim 6, wherein, when "b" is zero, the control unit outputs the control signal for directly connecting the m main flip-flops to the bypass circuit.

8. The display apparatus of claim 6, wherein, when "a" is zero, the control unit outputs the control signal for directly connecting the m main flip-flops to the bypass circuit and performs a control such that a pulse signal having a width of 1H is output to the pulse signal input terminal.

9. The display apparatus of claim 8, wherein the control unit performs a control such that a signal delayed by 1H×1/$2^c$ relative to the horizontal sync signal is output to the pulse signal input terminal.

10. The display apparatus of claim 8, wherein the control unit performs a control such that a clock pulse having a period of 1H and a length of 1H×b/$2^c$ is repeatedly output to the clock input terminal and the duty ratio signal input terminal.

11. The display apparatus of claim 10, wherein the control unit performs a control such that a signal delayed by 1H×1/$2^c$ relative to the horizontal sync signal is output to the clock input terminal and the duty ratio signal input terminal.

* * * * *